United States Patent [19]

Curtins

[11] Patent Number: 4,933,203

[45] Date of Patent: Jun. 12, 1990

[54] PROCESS FOR DEPOSITING AMORPHOUS HYDROGENATED SILICON IN A PLASMA CHAMBER

[75] Inventor: Hermann Curtins, Neuchatel, Switzerland

[73] Assignee: Institut de Microtechnique, Neuchatel, Switzerland

[21] Appl. No.: 376,952

[22] Filed: Jul. 7, 1989

Related U.S. Application Data

[63] Continuation-in-part of Ser. No. 100,915, Sep. 25, 1987, abandoned.

[30] Foreign Application Priority Data

Sep. 26, 1986 [CH] Switzerland .................. 03868/86

[51] Int. Cl.⁵ ............................................. B05D 3/06
[52] U.S. Cl. ..................................... 427/38; 477/314
[58] Field of Search ................................. 427/38, 314

[56] References Cited

U.S. PATENT DOCUMENTS 4,524,089  6/1985  Hague ..................................... 427/38
4,532,150  7/1985  Endo et al. ........................ 427/38 X
4,645,684  2/1987  Osada et al. ......................... 427/38
4,741,919  5/1988  Takasaki et al. ...................... 427/38

Primary Examiner—Bernard Pianalto
Attorney, Agent, or Firm—Frost & Jacobs

[57] ABSTRACT

The installation includes a plasma chamber containing two electrodes connected to a high-frequency generator, the substrate being mounted on one of the electrodes. A gas containing at least one silicon compound is introduced into the chamber and a plasma is created by a radiofrequency between the electrodes. The invention aims to obtain a high rate of deposition of amorphous semiconducting silicon on the substrate, at the same time as a small number of defects in the deposited film. This objective is achieved by selecting, for the ratio f/d between the frequency and the distance separating the electrodes, an optimum value included between 30 and 100 MHz/cm, the frequency being included between 25 and 150 MHz. For the optimum frequency, the deposition rate is a maximum and the number of defects is a minimum. This process may be utilized for the deposition of amorphous hydrogenated silicon or an alloy thereof from different gases or gas mixtures, and also for producing doped layers.

12 Claims, 3 Drawing Sheets

PROCESS FOR DEPOSITING AMORPHOUS HYDROGENATED SILICON IN A PLASMA CHAMBER

This is a continuation-in-part, of application Ser. No. 07/100,915, filed Sep. 25, 1987 now abandoned.

BACKGROUND OF THE INVENTION

The present invention relates to a process for depositing a semiconductor film of amorphous hydrogenated silicon or an alloy of amorphous hydrogenated silicon on a substrate in a plasma chamber containing at least one pair of electrodes connected to an electric high-frequency generator, wherein the substrate is connected to one electrode, the substrate being placed at a distance d from the other electrode, a gas containing at least one silicon compound is introduced into the chamber, and high-frequency electrical power is applied to the electrodes to produce a plasma between the electrodes. The invention also relates to an installation for implementing this process.

The deposition of amorphous hydrogenated silicon (a-Si:H) in a plasma reactor is described especially in U.S. Pat. No. 4,226,898 and it is generally employed, starting for example from compounds of the silane type ($SiH_4$, $Si_2H_6$, etc.) and doping gases, to make photodetector elements or photovoltaic cells. Amorphous layers of hydrogenated silicon alloys are also deposited, for example according to the formulae a-$Si_xGe_{1-x}$:H, a-$Si_xC_{1-x}$:H or a-$Si_xN_{1-x}$:H. In industrial applications one primarily aims to obtain adequate product quality, in particular a limited number of defects per unit volume, which defects produce localized states in the energy gap of the semiconductor, with as high a deposition rate as possible, hence at moderate cost. The plasma is produced in most cases by radiofrequency (RF) discharges between two electrodes, one of which carries the substrate, the plasma thus being capacitively coupled with a high-frequency generator.

The parameters affecting the deposition process are numerous and encompass notably: the interelectrode gap, the substrate temperature, the gas mixture employed, the pressure and the rate of gas introduction into the chamber, the power and the frequency of the RF discharge. It is moreover important to confine the plasma as far as possible to the zone situated between the two electrodes, which may be achieved especially by means of an appropriate choice of the following parameters: pressure, interelectrode distance, RF power.

To obtain a high deposition rate, one should principally increase the concentration of the plasma and/or the RF power density per unit surface of the substrate. However, the increase of these parameters has hitherto encountered limits due to the increase of the density of defects in the deposited film, that is, the number of defects per unit volume, in particular on account of a phenomenon of gas phase polymerization, so that the best deposition rates presently achieved at the industrial stage do not generally exceed 0.4 nm/s (4Å/s) for a defect density $N_s$, measured by the PDS (Photothermal Deflection Spectroscopy) method, in the order of $1-5 \times 10^{16}/cm^3$ for a film having a thickness in the order of 1 μm. Thus, the deposition of such a film lasts at least three quarters of an hour. Said PDS method is described by W.B. Jackson and N.M. Amer in Phys. Rev. B, 25, p. 5559-5562.

An example of attempts to increase the deposition rate is given by T. Hamasaki et al in Appl. Phys. Letters 44(6) 1984, p. 600-602. In this case, confinement of the plasma by a grid surrounding the zone of the electrodes and earthed enabled to obtain deposition rates of the order of 4 to 5 nm/s (40 to 45 Å/s while utilizing pure silane gas ($SiH_4$) and a standard frequency of 9 MHz. Nevertheless, except for the conductivities in dark and under illumination, the authors do not give any precise indications regarding the quality of the deposit obtained and one may expect a relatively high value of $N_s$.

U.S. Pat. No. 4,406,765 describes a process wherein the plasma is produced by superposition of a DC electric field and an electric field of high-frequency between 0.1 MHz and 100 MHz (or a pulsed electric field), in order to obtain above all a very high deposition rate. The quality of the film obtained is not indicated in detail: it should be expected to be inferior to that which is generally required for solar cells. This publication also does not indicate if certain frequency values are preferable in the very large range proposed. It may thus be presumed that a modification of the frequency has no appreciable effect in this technique.

The object of the present invention is to provide simple and effective means enabling to improve known processes of the type indicated above, in such a manner as to increase the deposition rate without increasing the number of defects, or while even reducing it with respect to deposits obtained by conventional processes.

SUMMARY OF THE INVENTION

A basic concept of the present invention resides in obtaining an increase of the deposition rate by applying to the electrodes an electric a.c. voltage with a radiofrequency higher than that which has been employed until now. Most of the research work carried out on the deposition of amorphous hydrogenated silicon has been effected with a frequency of 13.56 MHz because it is an industrial frequency, which does not produce major disturbances in radio communications, and because equipment utilizing this frequency has very widespread use. Moreover, an increase of the frequency in the plasma chamber tends to produce spurious discharges between one electrode and its support or the chamber, so that higher frequencies have in general been avoided. Finally, most researchers have hitherto considered that it was inadvisable to utilize a frequency appreciably higher than that of the plasma, that is, the ion relaxation frequency, which is of the order of 1 to 8 MHz.

On the other hand, research underlying the invention shows that very advantageous results may be achieved by applying a relatively high frequency to the electrodes, in combination with a particular geometry of the reactor.

According to a first aspect, the invention relates to a process of the type indicated in the preamble, characterized in that the frequency f is included between 25 and 150 MHz and in that the ratio f/d between the frequency f and the distance d is included between 30 and 100 MHz/cm. The distance d is preferably included between 1 and 3 cm.

In particularly advantageous embodiments of the process, the ratio f/d is included between 30 and 80 MHz/cm. Moreover, the frequency f is included between 30 and 100 MHz and the distance d is included between 1 and 2.5 cm.

As regards the electrical power P injected, that is, the power dissipated in the plasma and measured at the terminals of the two electrodes, the ratio between this power and the volume $V_p$ of the plasma present between the two electrodes is included between 0.02 and 0.2 W/cm$^3$ and preferably 0.04 and 0.15 W/cm$^3$. Moreover, a pressure included between 0.1 and 0.5 mbar is maintained in the chamber during the deposition phase and the substrate is maintained at a temperature preferably included between 230° and 350° C.

The gas introduced into the reactor may comprise one or several of the following substances: silane (SiH$_4$), disilane (Si$_2$H$_6$) and/or silanes of higher order, silicon tetrafluoride (SiF$_4$), hydrogen (H$_2$). In addition to the silicon compounds, the gas may comprise one or several supplementary substances for the deposition of an amorphous film containing an alloy of silicon and another substance and/or for modifying or doping the deposited film.

A first group of these substances comprises germane (GeH$_4$) and germanium tetrafluoride (GeF$_4$). A second group comprises methane (CH$_4$) and carbon tetrafluoride (CF$_4$). A third group comprises nitrogen (N$_2$) and ammonia (NH$_3$). A fourth group comprises phosphine (PH$_3$) and boroethane (B$_2$H$_6$). Substances selected from several of these groups may also be present simultaneously in the chamber. The input rate of silane gas may be included between 0.3 and 2.0 sccm/l of useful internal volume of the chamber, and preferably be approximately 1.2 sccm/l (1 sccm = 1 cm$^3$ NTP, that is, at normal conditions of temperature and pressure, per minute).

For the deposition of a film of silicon-nitrogen alloy, the process advantageously provides for the gas utilized to comprise a mixture of silane and ammonia in a ratio included between 0.03 and 0.3, the interelectrode distance d being included between 1 and 3 cm.

To implement this process, an installation may be utilized of the type comprising a radiofrequency generator, a plasma reactor provided with a chamber enclosing two electrodes connected to a generator via a matching grid, means for introducing gas into the chamber and means for extracting gas from the chamber, one of the two electrodes being provided with a support for the substrate, and the other electrode being disposed at a distance d opposite the substrate.

In an installation using the process of this invention the frequency f delivered by the generator is included between 25 and 150 MHz, and in that the ratio f/d is included between 30 and 100 MHz/cm.

BRIEF DESCRIPTION OF THE DRAWING

The present invention and its advantages will be more clearly apparent from the description of an example of an embodiment given below with reference to the drawings, wherein.

DETAILED DESCRIPTION OF THE INVENTION

Figure 1:
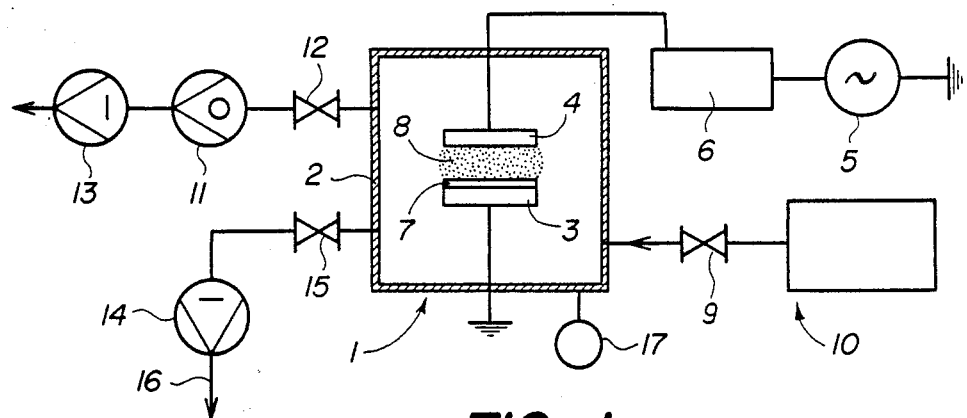
FIG. 1 is a simplified diagram of an installation for depositing amorphous hydrogenated silicon on a substrate in a plasma reactor.

The installation represented schematically in FIG. 1 has a known general configuration. It comprises a plasma reactor 1 including, within a vacuum chamber 2, a first electrode 3 which is connected to earth (but which could be maintained at a potential other than earth) and a second electrode 4 which is connected to a radiofrequency generator 5 via a matching grid 6. The electrodes 3 and 4 are disposed opposite each other, their respective surfaces being essentially plane. A substrate 7 in the form of a plate is fixed onto the first electrode 3 so that its free surface is situated at a distance d from the second electrode 4. In the electric circuit fed by the generator 5, the electrodes (including the substrate) thus form a capacitive element enabling to create a plasma 8 by electric discharge at high frequency between the electrodes when a gas is present in the chamber 2 under appropriate conditions. In the present case, the generator 5 is provided for producing radiofrequencies between 1 and 200 MHz. It should be remarked that, in an installation of this type, the substrate and the corresponding equipment might be disposed on the second electrode instead of the first, but this solution is generally less advantageous for reasons of electrical insulation.

The installation includes, in a known manner, gas feed means 10 comprising in particular one or several gas reservoirs and corresponding expansion valves for introducing different gases (pure or in the form of mixtures) into the chamber 2 of the reactor through one or several inlet valves 9, and means for extracting the gases from this chamber. In FIG. 1, a turbomolecular pump 11 is represented, whose suction side is connected to the chamber 2 via a valve 12, the pump 11 being followed by a first primary pump 13. A second primary pump 14 is connected to the chamber 2 via a valve 15, the outlet of this pump being connected to a gas evacuating circuit 16. A pressure manometer 17 is also represented, which indicates the pressure in the chamber 2. Various known means are moreover provided for heating and cooling the electrodes, the substrate and the chamber, but these are not represented in FIG. 1.

Figure 2:
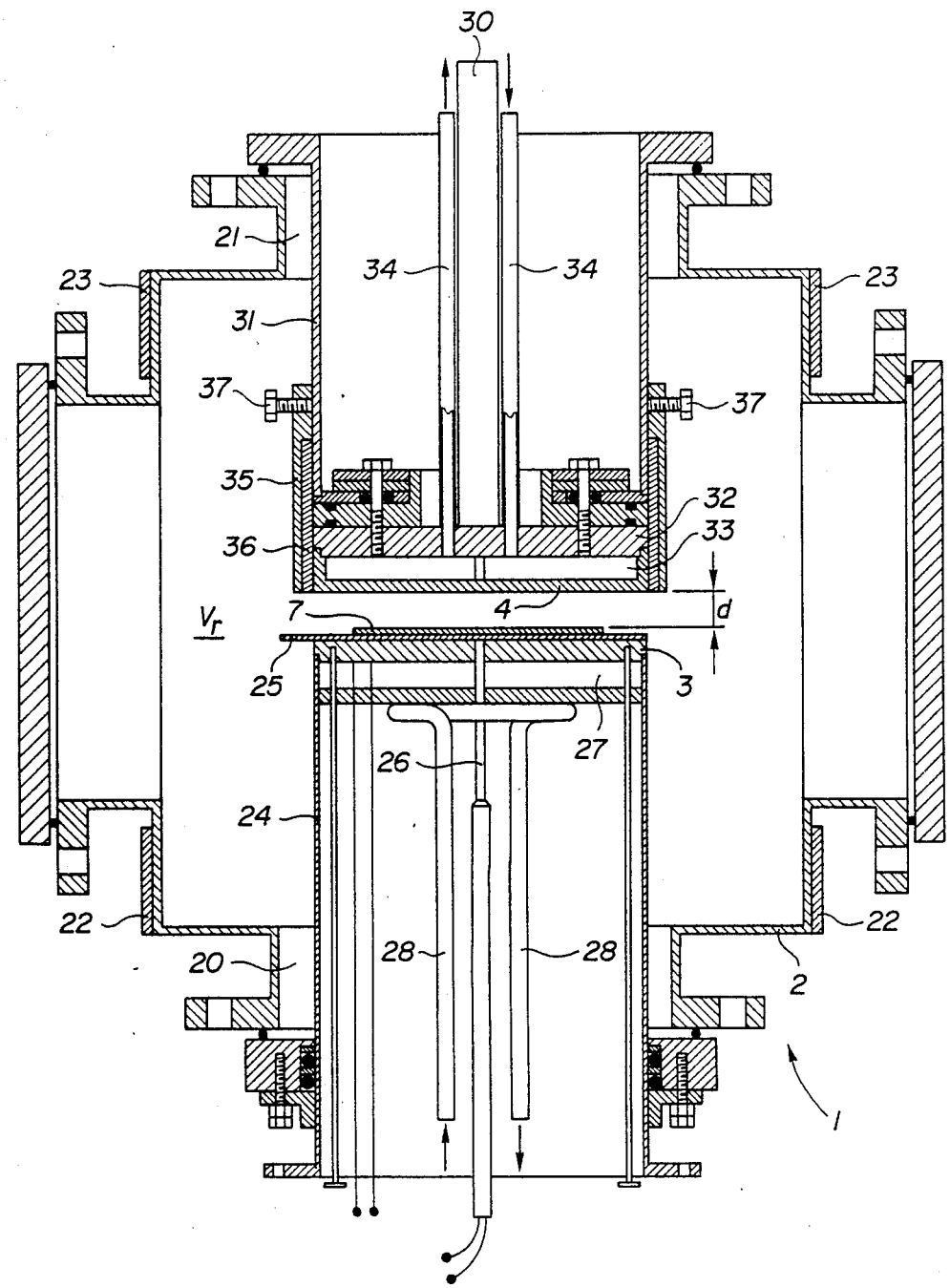
FIG. 2 is a schematic longituidinal sectional view of the reactor.

FIG. 2 shows in more detail the disposition of the electrodes 3 and 4 and the substrate 7 in the chamber 2 of the reactor 1. The chamber 2 is a closed, approximately cubical vessel provided with openings 20 and 21 for mounting the electrodes 3 and 4 and with several other openings for other components such as connecting pieces (not show) for introduction and extraction of the gases. In this example, the useful internal volume $V_r$ of the chamber 2, that is, the volume occupied by the gases, is 15 litres. Heating elements 22 and 23 are applied to the outer surface of the chamber 2.

The first electrode, that is, the electrode which is electrically connected to earth, is mounted at the extremity of a tubular electrode carrier 24 attached to the chamber 2. It is equipped with a substrate-support 25 which is easily interchangeable, a temperature probe 26, an electric heating element 27 and a water-cooling circuit 28, which may be used for cooling the electrode and the substrate at the end of the deposition process.

As for the second electrode 4, the so-called active electrode, it is connected to the high-frequency generator by means of a conductive rod 30 and it is mounted at the extremity of a tubular electrode-carrier 31 via an insulating support 32 which moreover defines, at the back of electrode 4, a cooling compartment 33 connected to a water circuit 34.

A metallic screen 35, which is electrically connected to earth, laterally surrounds the electrode 4, from which it is separated by a space filled with a dielectric material constituting a sheath 36 which prevents the occurrence of discharges on the sides of the electrode 4. This sheath is preferably made of refractory ceramic material for example of glass. The screen 35 is attached to the electrode-carrier 31 by means of a locking screw 37, in a longitudinally adjustable position. It is understood that either one or the other of the electrodes 3 and 4 may be earthed, or even neither of them. What is essential is that the conductive screen disposed around one electrode should be at the same potential as the other electrode.

The operation of this installation will be described below with regard to its use for carrying out the process according to the invention. Makining an amorphous hydrogenated silicon deposit, formed of a film on the substrate, generally comprises at least the three following stages:

(A) preparing the substrate (cleaning)
(B) conditioning the system (reactor and substrate)
(C) depositing the film.

The substrate may be of glass, metal, synthetic material, or other material. The examples cited below refer to a substrate of glass of Dow Corning mark No. 7059 or of glass coated with a metallic film. These substrates have a thickness of 0.8 mm. In stage A, the substrate is cut out to the appropriate dimensions (110×55 mm in the present case), is washed in several water and alcohol baths, then is mounted on an interchangeable support 25 to be attached to the first electrode 3.

In stage B, vacuum is created in the reactor chamber 2 by means of the pump 14 and then the pumps 11 and 13 until a pressure of $1-5\times10^{-6}$ mbar is obtained then the valve 12 is closed and conditioning with a hydrogen plasma is effected in the following manner. The chamber is heated by means of the heating elements 22 and 23 during about one hour, so as to obtain a superficial temperature of about 80° C. which may then be maintained during the entire deposition process. At the same time, the electrode 3 and the substrate-support 25 are heated to a temperature included between 230° and 350° C.

Hydrogen is then introduced into the chamber with an input rate of the order of 20 to 100 sccm (cm³ NTP, per minute), and is made to circulate by means of the primary pump 14 whose speed is adjusted so as to maintain in the chamber a pressure included between 0.1 and 0.5 mbar. In order to ensure proper cleaning of the substrate and the chamber, a plasma is produced by switching on the high-frequency generator 5 for a duration of 10 to 60 minutes. The conditions of pressure, power, etc. are selected in such a manner that the plasma is present in the entire chamber, while evidently being particularly dense between the two electrodes. After this conditioning, the gas flow is interrupted and the chamber is evacuated by means of the pumps 11 and 13 to about $10^{-6}$ mbar. The valve 12 is then closed and the system is ready for the stage C of actual deposition.

In this stage C, the gas feed means 10 are connected so as to deliver to the interior of the chamber 2 a pure gas or a gas mixture containing at least one silicon compound, for example a mixture of silane ($SiH_4$) and hydrogen ($H_2$). The valve 15 is open and the primary pump 14 is operated so as to maintain a given absolute pressure p in the chamber. As soon as the pressure is stabilized, the generator 5 is switched on to produce a plasma between the two electrodes, and more exactly between the substrate 7 and the second electrode 4. It is important that the plasma be confined to the zone included between the two electrodes, thanks to a judicious choice of the parameters such as the pressure p, the distance d and the electrical power density. The role of the frequency f will be discussed further below.

On the other hand, all parameters affecting this stage must be chosen in such a manner that the quality of the silicon film being deposited on the substrate is as good as possible. On this account, the experiments which have served as basis for the present invention have shown that the advantageous values of these parameters are the following for an amorphous hydrogenated silicon film:

| | |
|---|---|
| interelectrode distance | d = 10-30 mm |
| substrate temperature | T = 230-350° C. |
| absolute pressure | p = 0.1-0.5 mbar |
| mixture of $SiH_4$ in $H_2$ | 10-100% $SiH_4$ |
| gas input rate referred to $V_r$ | 0.3-5.0 sccm/l |
| electrical power density | $P/V_p$ = 0.02-0.2 W/cm³ |

Figure 3:
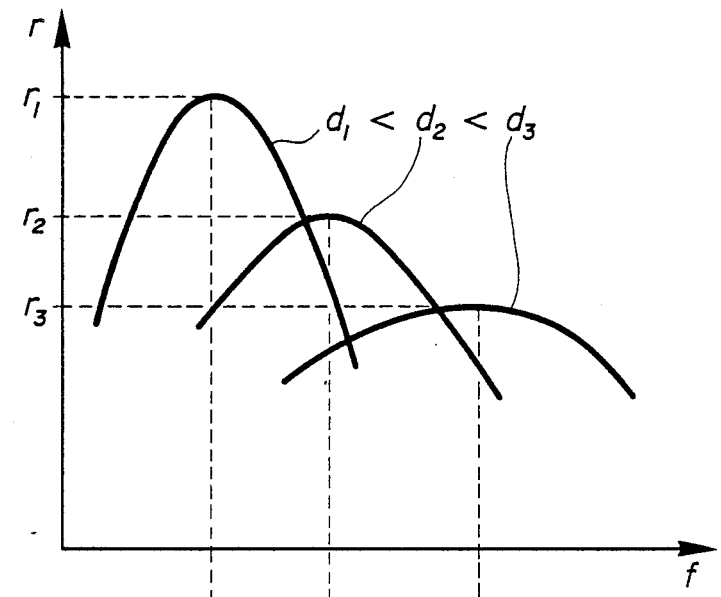
FIG. 3 represents, in the form of schematic diagrams, deposition rates r and defect densities $N_s$ obtained with different frequencies f and different interelectrode gaps d, in an installation according to FIGS. 1 and 2.
Figure 3:
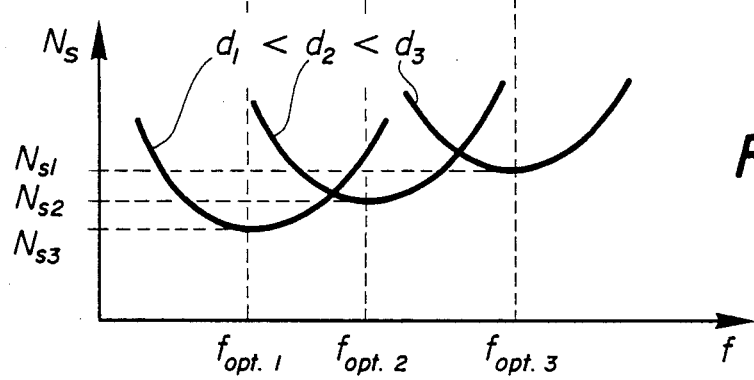

An essential aspect of the present invention is the fact that appropriate combinations of the interelectrode distance and the frequency f applied to the electrodes has a very important influence on the deposition rate r, that is, the rate of growth of the thickness of the deposited film. FIG. 3 shows qualitatively that, for a given distance d, there exists in the radiofrequency range an optimum frequency for which the deposition rate r is a maximum. Moreover, it is observed that the defect density $N_s$ of the film (for equal deposition periods), is a minimum precisely for this optimum frequency. For equal thicknesses, the curve $N_s$ is more flattened. On the other hand, it is observed that, when the distance d increases, the corresponding optimum frequency $f_{opt}$ also increases, so that one may write:

$$\frac{f_{opt}}{d} \approx 45 \text{ MHz/cm}$$

at least in the range extending up to f=200 MHz. It is also remarked that when the value of d increases, the maximum value of the deposition rate decreases and the minimum defect density increases, that is, the best results are obtained with small distances d if the frequency f is at the optimum. However, it is well known that the value of d is limited downwards by other phenomena. In practice, a value of d=10 mm may be currently considered a minimum.

Figure 4:
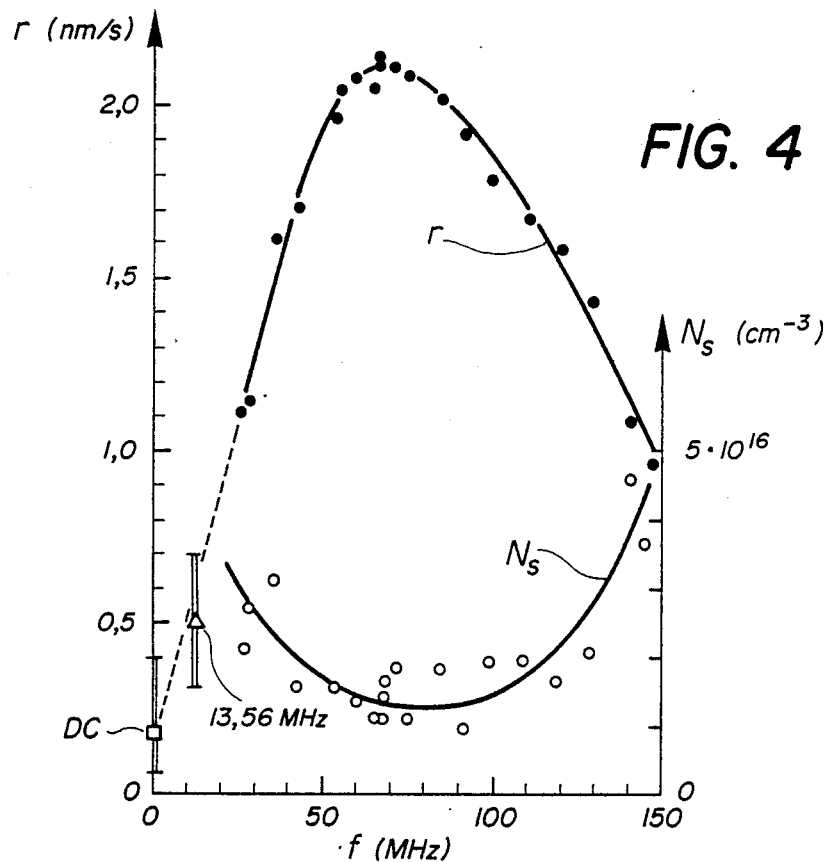
FIG. 4 is a diagram similar to FIG. 3, for a given distance d.

FIG. 4 shows in more detail the distribution of the experimental values of the deposition rate r and the defect density $N_s$ obtained in the frequency range f=27.1-150 MHz with the following parameters:

| | |
|---|---|
| interelectrode distance | d = 15 mm |
| substrate temperature | T = 280° C. |
| absolute pressure | p = 0.28 mbar |
| gas | 100% $SiH_4$ |
| gas flow rate/$V_r$ | 1.3 sccm/l |
| power density | $P/V_p$ = 0.1 W/cm³ |
| duration of deposition | about 20 min. |

The two curves r and $N_s$ are correlated curves. By way of comparison, there have also been represented in this figure typical values of the deposition speeds obtained with plasmas produced with DC voltage and with a frequency of 13.56 MHz, as well as the dispersion of the corresponding values provided by the literature.

In the present case, one obtains values of r which are far superior, already at the industrial frequency of 27.1 MHz and at least up to 150 MHz. Below 25 MHz, the speed r drops rapidly. It is remarked that, in the above-mentioned conditions, the optimum frequency is close to 70 MHz and enables to obtain deposition rates r superior to 2.0 nm/s. At the same time, the values of $N_s$ determined by the PDS method lie in the range of 1-$2 \times 10^{16}/cm^3$ for a thickness of about 2 μm, and inferior to $2-3 \times 10^{15}/cm^3$ for a thickness of about 20 μm. It should be recalled that the quality of a silicon film, determined by this method, is considered good if the value of $N_s$ is inferior to $5 \times 10^{16}/cm^3$ for thicknesses of about 1 μm.

Similar results may be obtained by applying the above-mentioned process to deposit on the substrate a semiconducting film comprising an amorphous silicon alloy with elements such as nitrogen, phosphorus, boron, etc. In particular, the applicant has experimentally obtained, for the deposition of a Si-N alloy while utilizing the same frequency range, results qualitatively similar to those in FIG. 4 from a mixture of silane gas with ammonia and/or nitrogen. The values of the parameters indicated below enabled to obtain amorphous Si-N films of good quality:

| | |
|---|---|
| interelectrode distance | d = 10–30 mm |
| substrate temperature | T = 200–400° C. |
| absolute pressure | p = 0.1–1.0 mbar |
| silane input rate/$V_r$ | 0.05–2.0 sccm/l |
| mixture ratio $SiH_4/NH_3$ | 0.03–0.3 |
| electrical power density | $P/V_p$ = 0.05–0.5 W/cm$^3$ |

In particular, Si-N films having a high optical transparency and dielectric breakdown fields as high as 5–10 MV/cm could be deposited at a rate of 0.5–1.0 nm/sec while utilizing the following parameters:

| | |
|---|---|
| interelectrode distance | d = 15 mm |
| substrate temperature | T = 300° C. |
| absolute pressure | p = 0.5 mbar |
| silane input rate/$V_r$ | 0.4 sccm/l |
| mixture ratio $SiH_4/NH_3$ | 0.1 |
| electric power density | $P/V_p$ = W/cm$^3$ |

Figure 5:
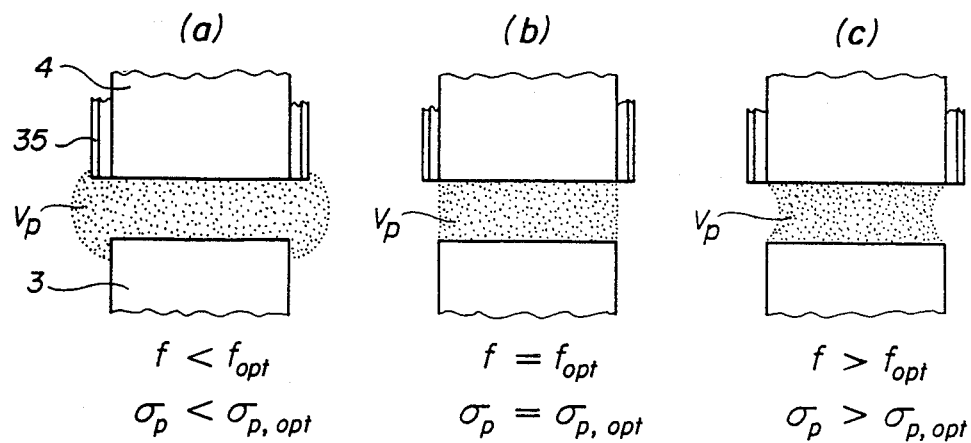
FIG. 5 is a schematic longitudinal sectional view, showing the form of the zone where the plasma appears with different frequencies.

The existence of an optimum frequency with respect to a given interelectrode distance may be explained in that it corresponds to an optimum value of the conductivity $\sigma_p$ of the plasma, for a given set of parameters. This phenomenon is illustrated by FIG. 5 for different frequencies f (all other parameters being maintained constant, in particular the applied electric power). In this figure, there has been represented in dashed lines the zone where the plasma is luminous (volume $V_p$).

On the respective diagrams (a), (b) and (c), the frequency f and the conductivity $\sigma_p$ are respectively lower, equal to and higher than the optimum values $f_{opt}$ and $\sigma_{p,opt}$. Thus, by choosing the adequate frequency, one may be placed in the case (b) and then obtain an effect of self-confinement of the plasma which enables to attain particularly good performance. This method may also be turned to account to avoid the prior art use of a grid which surrounds the zone lying between the electrodes in order to confine the plasma to this zone, such a grid forming an obstacle to the introduction of the substrates between the electrodes.

It is understood that the optimum frequency depends not only on the parameters mentioned above, but also on the composition of the utilized gas or gas mixture. With the help of a visual observation of the phenomenon illustrated by FIG. 5, one may approximately determine the optimum frequency for the effective conditions prevailing in the plasma reactor. One may moreover also envisage deliberately choosing a frequency which deviates from the optimum so as to adjust the deposition rate to a value lower than the optimum, for example for the production of a particularly thin layer during a given period, imposed by particular production constraints, or for adapting the effectiveness of doping a layer to a desired value. It should also be noted that one may utilize different respective frequencies for the stage for conditioning the system and the stage for depositing the silicon film.

I claim:

1. A process for depositing a semiconductor film of amorphous hydrogenated silicon, an alloy of amorphous hydrogenated silicon, or mixtures thereof, on a substrate in a plasma chamber containing at least one pair of electrodes connected to a high frequency electric generator, wherein the substrate is connected to one electrode and positioned at a predetermined distance between 1 and 3 cm from the other electrode, wherein a gas containing at least one silicon compound is introduced into said chamber, electrical power at a frequency between 25 and 150 MHz is applied to said electrodes to produce a plasma therebetween, and wherein a self-confinement of the plasma between said electrodes is obtained by selecting a ratio of the frequency to said predetermined distance between 30 and 100 MHz/cm.

2. The process claimed in claim 1, wherein said ratio is between 30 and 80 MHz/cm.

3. The process claimed in claim 2, wherein said frequency is between 30 and 100 MHz and said distance is between 1 and 2.5 cm.

4. The process claimed in claim 1, wherein the ratio of electrical power dissipated in said plasma and measured at the terminals of said two electrodes to the volume of said plasma present between said two electrodes is between 0.02 and 0.2 W/cm$^2$.

5. The process claimed in claim 1, wherein a pressure ranging between 0.1 and 0.5 mbar is maintained in said chamber during deposition.

6. The process claimed in claim 1, wherein said substrate is maintained during deposition at a temperature between 230° and 350° C.

7. The process claimed in claim 1, wherein said gas introduced into said chamber comprises at least one of silane, disilane, silanes of higher order, silicon tetrafluoride, and hydrogen.

8. The process claimed in claim 7, wherein said gas includes at least one of germanium tetrahydride, germanium tetrafluoride, methane, carbontetrafluoride, nitrogen, ammonia, phosphine, and boroethane.

9. The process claimed in claim 7, wherein said gas is silane and is introduced into said chamber at a flow rate between 0.3 and 2.0 sccm (cm$^2$ NTP/min) per liter of internal volume of said chamber.

10. The process claimed in claim 8, wherein a film of a silicon-nitrogen alloy is deposited, wherein said gas introduced into said chamber comprises a mixture of silane and ammonia in a volumetric ratio between 0.03 and 0.3, and said predetermined distance is between 1 and 3 cm.

11. The process claimed in claim 1, wherein the plasma is confined between said pair of electrodes without use of a grid surrounding said plasma.

12. The process claimed in claim 11, wherein said plasma is confined by selecting an optimum value of said frequency for a given value of said predetermined distance.

* * * * *